(12) United States Patent
Bosshart (10) Patent No.: US 9,484,095 B2
(45) Date of Patent: Nov. 1, 2016

(54) TCAM PROVIDING EFFICIENT MOVE CONTENTS OPERATION

(71) Applicant: Texas Instruments Incorporated, Dallas, TX (US)

(72) Inventor: Patrick W. Bosshart, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/618,057

(22) Filed: Feb. 10, 2015

(65) Prior Publication Data

US 2015/0262668 A1    Sep. 17, 2015

Related U.S. Application Data

(60) Provisional application No. 61/939,024, filed on Feb. 12, 2014.

(51) Int. Cl.
*G11C 15/00* (2006.01)
*G11C 15/04* (2006.01)

(52) U.S. Cl.
CPC ..................................... *G11C 15/04* (2013.01)

(58) Field of Classification Search
CPC ... G11C 15/04; G11C 15/046; G11C 15/043; G11C 15/00
See application file for complete search history.

(56) References Cited

U.S. PATENT DOCUMENTS

2005/0001744 A1*    1/2005    Roth .................. G11C 15/00
341/50

\* cited by examiner

*Primary Examiner* — Richard Elms
*Assistant Examiner* — Mohammed A Bashar
(74) *Attorney, Agent, or Firm* — John R. Pessetto; Charles A. Brill; Frank D. Cimino (57) ABSTRACT

An embodiment of the invention includes a Ternary Content Addressable Memory (TCAM) that includes a group of TCAM block. Each TCAM block stores a number of match entries. Each TCAM block is ranked in priority order. The TCAM also includes a group of TCAM headpointers. There is a TCAM headpointer coupled to each TCAM block. The TCAM headpointer indicates the highest priority match in the group of match entries in a TCAM block. The match entries within a TCAM block are prioritized in circular priority order starting from the highest priority match.

3 Claims, 6 Drawing Sheets

TCAM PROVIDING EFFICIENT MOVE CONTENTS OPERATION

CROSS REFERENCE TO RELATED APPLICATION(S)

This application claims the benefit of and priority to U.S. Provisional Application Ser. No. 61/939,024, filed Feb. 12, 2014, which application is hereby incorporated herein by reference.

BACKGROUND

Network switches inspect fields in the headers of Ethernet packets in order to determine what action to perform on the packet. Actions may include sending the packet to a specific output port and a specific queue for that port, multicasting or broadcasting the packet to several ports, sending the packet to a network controller so it can determine the packet's outcome, or dropping the packet by not sending it to any destination. Packets have headers representing several levels of the 7 layer OSI (Open Systems Interconnection) model defining packet transport. Typically, these headers follow one another in increasing layer number of the OSI model. As an example, a packet may begin with a MAC (Media Access Control) header at level 2, followed by an IP (Internet Protocol) header at level 3, followed by a TCP (Transmission Control Protocol) header at level 4. Each of these headers internally has a number of individual fields which may be inspected by the switch. At the level 2 MAC layer, the MAC header contains MAC source and destination addresses, along with an ethertype. An IP header at layer 3 contains IP source and destinations and an IP protocal, among other fields. A TCP header at level 4 contains TCP source and destination port numbers, among other fields. All these fields may be inspected by the switch, and may be modified in the course of determining the disposition of the packet.

DETAILED DESCRIPTION

An embodiment of the invention includes a Ternary Content Addressable Memory (TCAM) that includes a group of TCAM block. Each TCAM block stores a number of match entries. Each TCAM block is ranked in priority order. The TCAM also includes a group of TCAM headpointers. There is a TCAM headpointer coupled to each TCAM block. The TCAM headpointer indicates the highest priority match in the group of match entries in a TCAM block. The match entries within a TCAM block are prioritized in circular priority order starting from the highest priority match.

Switches usually function by associatively matching packet header fields against internal switch tables. For example, a Level 2 switch may contain a table of MAC destination addresses. Each incoming packet has its MAC destination address extracted, then the MAC destination table is searched to determine whether it contains the packet's MAC destination address. If it does, an action is retrieved from data associated with the matching table entry, which specifies the output destination port for the packet. A match/action paradigm is formalized by the OpenFlow standard, but both OpenFlow and conventional (non OpenFlow) switches perform the same functions of matching packet header fields against internal tables, and performing actions specified by data associated with the matching entry.

Some tables used in switches allow ternary matches, where for a table entry, each bit may be 1, 0 or don't care (also called a wildcard bit). If the table entry bit is a 1 or 0, the incoming packet header bit must be equal to that 1 or 0 in order for the table entry to match, whereas if the table entry is a don't care, the corresponding packet header bit may be either 1 or 0, with the header bit effectively not participating in the match requirement.

When tables do not contain any wildcard bits, they are referred to as exact match tables. These have efficient hardware implementations, where the dominant cost of a table entry is storing its match value in a memory, such as SRAM (Static Random Access Memory). They may be organized and accessed as hashtables. Cuckoo hashtables are specific types of hashtables which typically improve the hashtable collision problem by using a hash fill algorithm providing high occupancy; most of the entries provided by the hashtable SRAM will be able to be filled with match entries. For example, a 4 way Cuckoo hashtable can be filled to at least 95% occupancy.

When tables contain wildcard bits, they are more expensive to implement, and at the performance levels of typical hardware switches are usually implemented using TCAMs (Ternary Content Addressable Memories). In addition to storing a ternary value at each table bit location, TCAMs include matching logic to determine whether each TCAM entry matches against a search word provided as an input to the TCAM. TCAMs are more expensive to implement than SRAMs, where expense is measured as the amount of Silicon area required to implement a bit of a single match entry. This is because a TCAM actually must contain two SRAM bit cells to store the two bits required to represent the three values of a ternary entry. Furthermore, there is logic attached to each bitcell to determine whether it matches (in a ternary sense) its bit of the search word, and to combine all individual bit matches into a single output representing whether that TCAM entry matched or not.

A TCAM table may be 6-7 times larger in area than an equivalent exact match table. It also dissipates substantially more power. As a result, the amount of TCAM table provided on switches is typically much smaller than the amount of SRAM-based exact match table.

Network switches may contain a number of separate TCAM tables, or configurable banks of TCAM which may be used as desired to make either separate tables or a smaller number of larger tables, as described in U.S. patent application Ser. No. 14/072,989 "An Openflow Match and Action Pipeline."

When TCAMs are used in switch tables, it is possible for more than one TCAM entry to match the incoming search data, typically a set of fields from the packet header. In that case, the fact that the TCAM entries are ordered is used. The ordering is used as prioritization, and the highest priority match is output. The Openflow standard specifically states that match table entries are ordered and the highest priority match is output. Each TCAM entry has an address, and prioritization can be arbitrarily chosen with either the highest address or the lowest address having highest priority. These are entirely equivalent at the circuit level; it is possible to switch from one view to the other simply by inverting the logic levels of the addresses. The convention used here is that higher addresses have higher priority; this will be maintained throughout but is not meant to be limiting.

Since entries are ordered in a TCAM, when a new entry is to be added, it often must be added into a specific place (i.e. between two specific adjacent existing entries). It is also possible that entries divide into groups, where within a group entries may be freely ordered, but each group must place all its entries together, above all lower groups and below all higher groups. While this represents an extra degree of freedom in placing entries, it will be ignored for this discussion, since it is application dependent. The general case will be considered, where when an entry is to be added, two existing neighboring entries are identified, between which the new entry must be placed.

As a result of this ordering requirement, adding an entry can result in the requirement to move existing entries. In one case, every entry must be moved. In this case, if a TCAM with N entries has all locations but location 0 full, and the entry to be added is higher in priority than all existing entries, it must be added at the highest location N−1. The contents of location N−1 must be shifted down to N−2, which must also be shifted down one, all the way to the contents at location 1, which move to the free entry at location 0. The same is true if location N−1 is the only free one and the new entry should be added at location 0. It forces every entry to shift up one.

If a TCAM is partially full, when an entry needs to be added, the number of entries requiring relocation can be calculated. Starting at the target location where the new entry is to be added, scan upwards, counting the number of entries until a free location is found. That would be the number of moves required if entries are evicted upwards. Then scan downwards, counting the number of entries until a free location is found. That would be the number of moves required if entries are evicted downwards. Choose the lesser. This can be simply stated as the number of required moves is the distance from the target location to any free location.

If a TCAM is mostly full, it may be advantageous to spread the remaining free locations evenly throughout the TCAM locations. In that way, the worst distance from anywhere to a free location, is minimized. These considerations have been covered in the literature, but in general, this approach involves background overhead to manage the TCAM vacancies.

Figure 1:
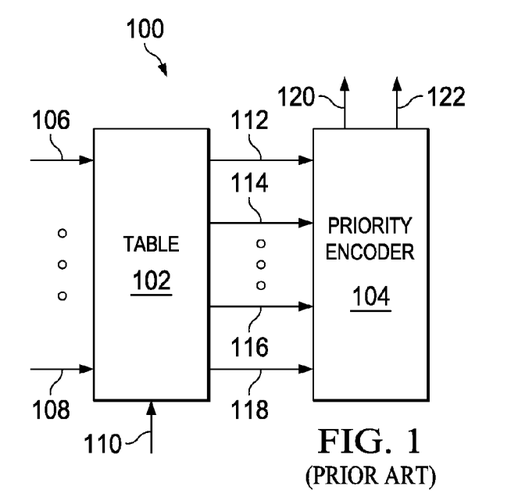
FIG. 1 is a block diagram illustrating a TCAM (Ternary Content Addressable Memory). (Prior Art)

FIG. 1 is a block diagram illustrating a TCAM (Ternary Content Addressable Memory). The TCAM of size N words can be thought of as a table 102, with addresses ranging from 0 to N−1. By convention, the highest addresses starting at N−1 106 have the highest priority, with the lowest addresses having the lowest priority, all the way down to address 0 108 with the lowest priority. When search data 110 is presented to the TCAM 100, all entries determine whether they match the search data 110, and their match outputs 112-118 go to a priority encoder 104, a logic circuit which returns the address of the highest priority input 122, as well as returning an indication whether any match occurred 120.

Figure 2:
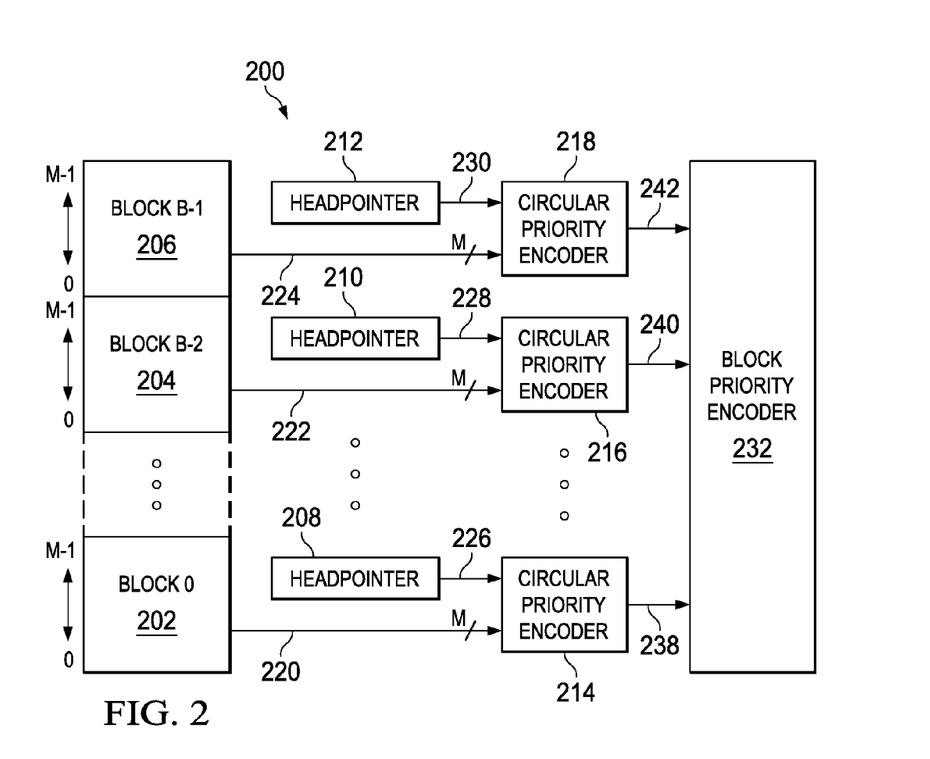
FIG. 2 is a block diagram of a TCAM (Ternary Content Addressable Memory) according to an embodiment of the invention.

An embodiment of the invention is shown in FIG. 2 where the TCAM 200 is broken into B blocks of M words each. Though not necessary, it is convenient to make M a power of 2. Each block 202-206 can be identified by a block-address, ranging from 0 to B−1, and each entry within a block can be identified by a local-address ranging from 0 to M−1. Associated with each of the B blocks 202-206 is a head pointer, 208-212, pointing to the local-address of the entry with the highest priority within the block. The number of required moves for an entry addition will be minimized when M and B are both on the order of the square root of N, where N again is the total number of words in the TCAM 200.

Each block B also has a circular priority encoder 214-218, which receives a total of M match outputs 220-222 from the block, in addition to the headpointer address 226-230. A block priority encoder 232 inputs a bit vector, and outputs the address of the highest priority input 236, where priority is fixed with the highest (most-significant) input bit having the highest priority, and input bit 0 having the lowest priority. (While it could also use bit 0 as highest priority, by convention this discussion consistently uses msb as highest priority).

Figure 3A:
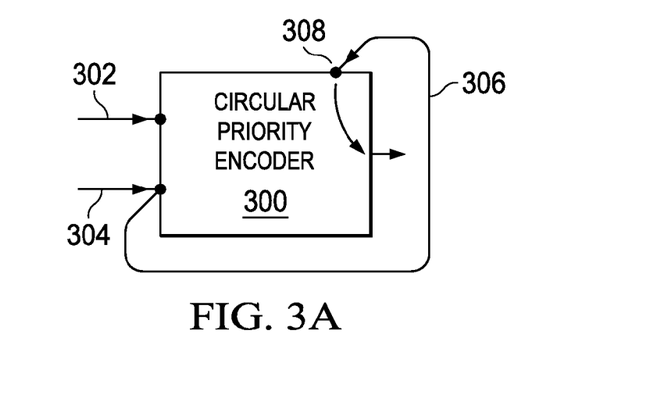
FIG. 3a is a block diagram of a circular priority encoder according to an embodiment of the invention.

By contrast, a circular priority encoder 300, as shown in FIG. 3a, receives its indication of the highest priority signal from the headpointer 302, so starting with that bit and moving downwards to bit 0, finds the address of the most significant input bit which is set to 1, detecting 1's in the bit positions of normal input 304 in FIG. 3a. If none are found, the circular priority encoder wraps around 306, starting with the most significant input bit, and moving down to the bit just above the headpointer 302 address, finds the most significant input bit which is set to 1, detecting 1's in the bit positions of wrapped input 308 in FIG. 3a. The circular priority encoder 300 is therefore able to programmably set the location of its highest priority using the headpointer 304.

Figure 3B:
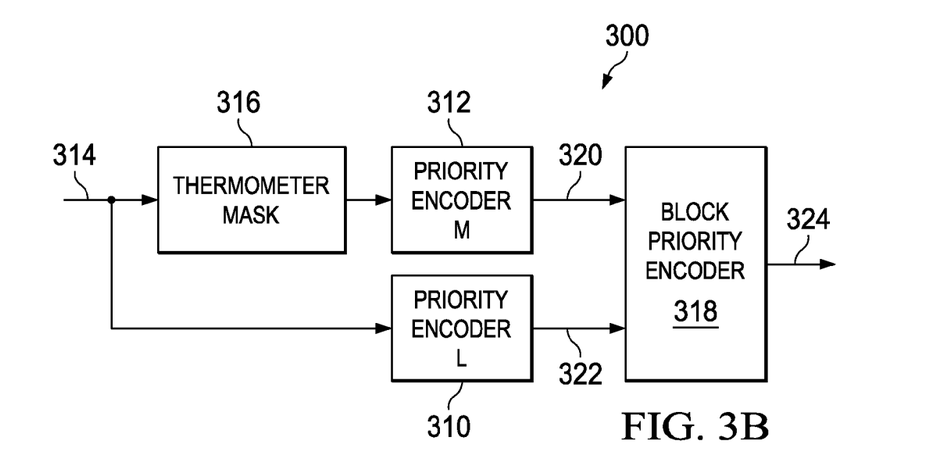
FIG. 3b is block diagram of a circular priority encoder according to an embodiment of the invention.

An embodiment of a circular priority encoder 300 is illustrated in FIG. 3b. In this embodiment, two copies 310 and 312 of a priority encoder are used, with the input data 314 broadcast to both 310 and 312. The more significant priority encoder 312 receives a copy of input data 314 operated on by a thermometer mask 316. The thermometer mask outputs a 1 in all bit positions at or below the headpointer's value 302, and outputs a 0 in all bit positions above the headpointer's value 302. This circuit is easily constructed by those skilled in the art. The more significant priority encoder 312 therefore detects 1's in the bit positions labelled normal input in FIG. 3a. The less significant priority encoder 310 of FIG. 3b detects 1's in the bit positions labelled wrapped input in FIG. 3a, as well as redundantly detecting normal input bits. The block priority encoder 318 chooses priority encoder 312 output 320 if it has found a 1, otherwise it chooses priority encoder 310 output 322.

Figure 4:
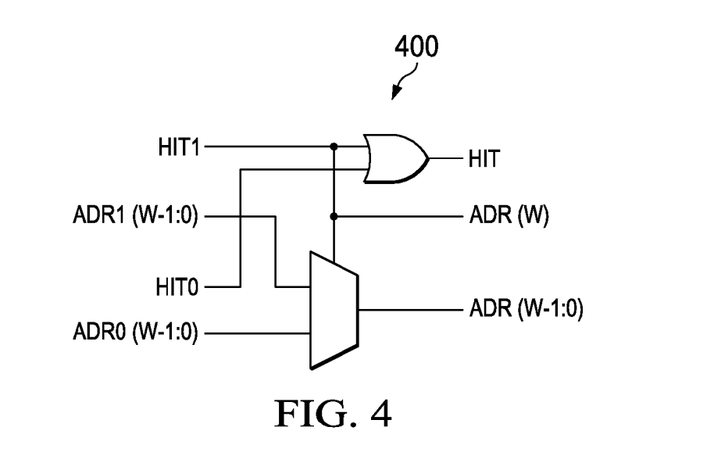
FIG. 4 is a schematic diagram a modulo-2 block priority encoder according to an embodiment of the invention.

The practice of building a priority encoder starts with priority encoders with small input width, then merges them in groups (often groups of 2) using a block priority encoder. This process is repeated hierarchically, for example doubling the priority encoder width with each added block priority encoder stage. A circuit diagram of a modulo-2 block priority encoder is shown in FIG. 4. There are two sets of inputs: HIT1 and ADR1($w$-1:0) being the more significant, and HIT0 and ADR0($w$-1:0) being the less significant. With input addresses ADR1 and ADR0 being of width w, each input represents the output of an earlier priority encoder of input width $2^w$. If HIT1 is true, the output address bits ADR(w-1:0) are selected from ADR1($w$-1:0), otherwise they are selected by ADR0($w$-1:0) (in which case they will be used if HIT0 is true and unused if it is false). The output address adds one bit of width, an msb, which is 1 if HIT1 is true and the HIT was therefore in the top half of the range represented by the concatenation of the two inputs. The two HIT signals are or'ed (i.e. a binary logical OR function is performed) together to produce the composite HIT output signal. This circuit 400 may be arranged in a tree, with the number of instances halving with each successive stage, in order to build a conventional priority encoder. Low level circuit details, such as minimizing the number of logic inversions using inverting logic, are omitted, but can easily be done by those skilled in the art.

Using the modulo-2 block priority encoders of FIG. 4 as building blocks, the circular priority encoder 300 of FIG. 3b can be implemented in 1+log 2(w) stages. There is additional delay due to the thermometer encoder, but the delay from the match inputs 314 to the output 324 is just the 1+log 2(w) block priority encoder stage delays, plus a gate to AND the thermometer code with the input 314.

Figure 5:
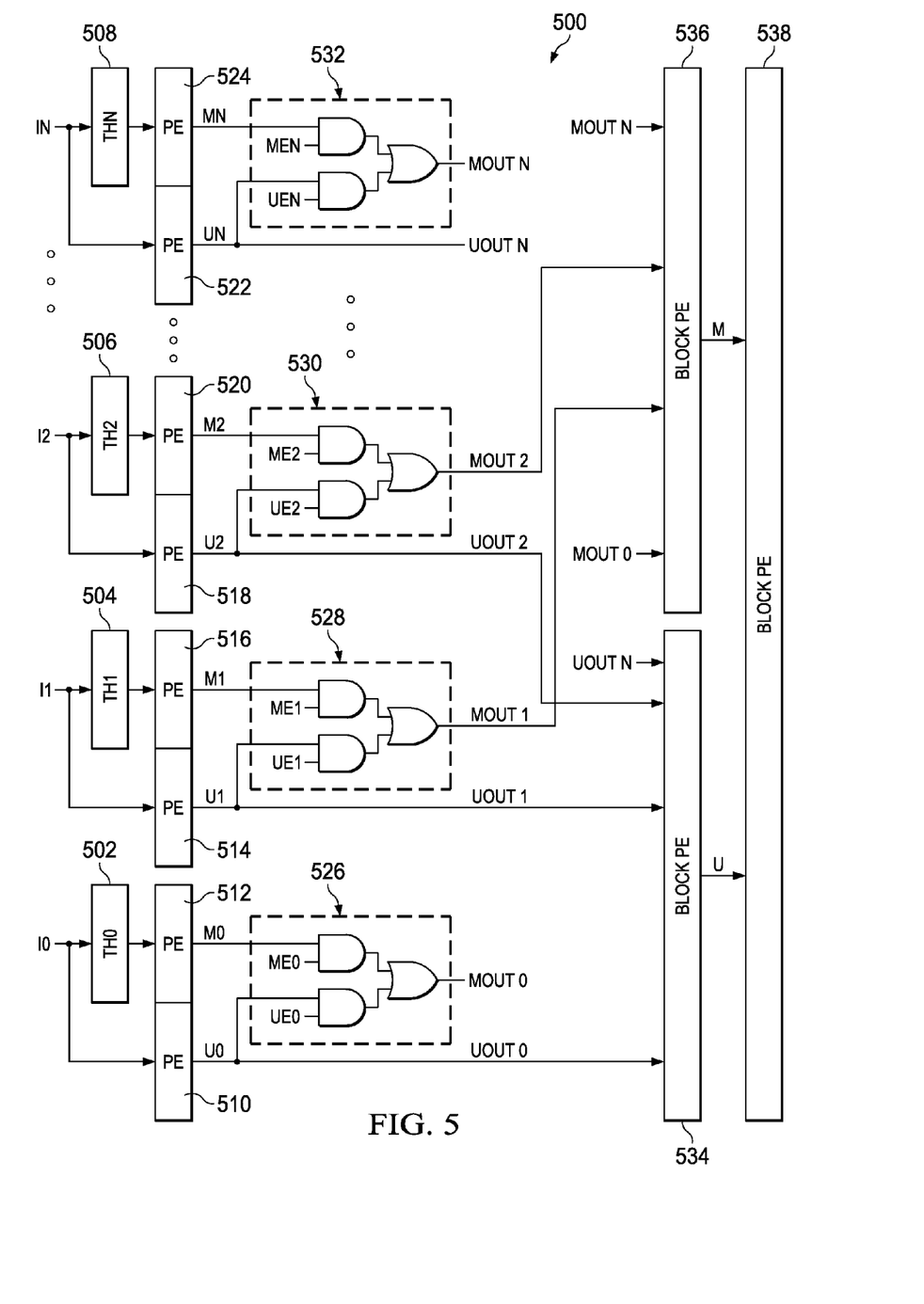
FIG. 5 is a block diagram of a hierarchical thermometer decoder circuit according to embodiments of the invention

While the implementation of FIG. 3b has a minimal delay of one gate plus 1+log 2(w) block priority encoder stage delays from the match inputs 314 to the output 324, it also has the thermometer code delay from the headpointer input 302. Other architectures can do hierarchical thermometer decoding, reducing the input thermometer code delay. FIG. 5 is an example of a hierarchical thermometer decoding circuit 500. In this example, the input I0-IN is broken into a number of smaller fields, from 0 to N, where the field width is a power of 2 bits. Each field, 0-N, has its own block, with a thermometer decoder 502-508, two priority encoders 510-524 and output and-or logic 526-532. The thermometer decoders 502-508 input the lsbs of the head pointer. If the logic block width of each field is w, the thermometer decoder inputs log 2(w) lsbs from the headpointer. Each block has two priority encoders 510-524, producing a masked output M0 through MN and an unmasked output U0 through UN, where the masked output is the output of the priority encoder 512, 516, 520, 524 receiving thermometer code gated inputs. Merging the output of the two priority encoder outputs, M and U for each block, is an and-or gate 526-532 producing a final masked output for each block, MOUT0 through MOUTN as shown in FIG. 5. The masked and unmasked outputs M and U are each meant to represent the composite of the HIT and address output signals of a block priority encoder. The unmasked output of each block is also an output of this higher level block. For each and-or gate 526-532, the M input is enabled by an enable inputs ME0-MEN, for masked-enable, and the U input is enabled by an enable inputs UE0-UEN, for unmasked enable. The ME0-MEN and UE0-UEN signals are produced by operating on the remaining msbs of the headpointer code not used by the block thermometer decoders 502-508.

For any thermometer code output using the headpointer value as input, the msb's of the headpointer will point to one of the logic blocks, and the lsb's of the headpointer will identify the most significant bit of that block which is contained within the overall thermometer code mask. For example, if there are 32 blocks in FIG. 5, each 16b wide, the total width is 512 bits, for a 9 bit thermometer code. The bottom 4 bits form the inputs to the thermometer decoders in each block, and the top 5 bits represent which is the top block having any enabled outputs. To obtain outputs masked by the full thermometer code, for the top block with any enabled outputs, identified by the MSB (most significant bit) value of the headpointer, the masked priority encoder output M should be used, for blocks below that top block the unmasked priority encoder output U should be used, and for blocks above that top block the outputs should be zeroed. This is the function of the and-or gate 526-532. The and-or gates 526-532 produce a set of masked priority encoder outputs MOUT0 through MOUTN, which correctly represent thermometer code masking by the headpointer. The Me masked enables ME0 through MEN, are enabled by detecting values 0 through N respectively on the headpointer msb's. For an Me signal MEk, it will be true if headpointer<<lsbs>>=k. For each unmasked enable output UE0 through UEN, it will be enabled if the headpointer msb code is greater than the UE index. For UEk, its logic function is headpointer<<msbs>>>k.

As an example, for a headpointer code 0x1a7 for the system above with 32 16 bit blocks, the 4 lsbs, with value 7, drive the thermometer decoders in all the blocks, enabling bits 0 to 7. The 5 msb's have value 0x1a (=26), so ME26 will be true and all the others will be false. UE25 to UE0 will be true and all the others will be false. Then the masked outputs MOUT0 through MOUT31 will represent the partial priority encoding, up through the bottom 4 bit, of an input masked by the thermometer decoding of the headpointer code 0x1a7.

These masked outputs MOUT0-MOUTN get combined through an stage of block priority encoder 536 as shown in FIG. 5 to produce a single masked priority code output equivalent to the top priority encoder output M of FIG. 3b. The unmasked priority encoder outputs UOUT0-UOUTN of all blocks are similarly merged through another block priority encoder 534 to produce a single unmasked priority encoder output equivalent to the bottom priority encoder output U of FIG. 3b. These two block priority encoder outputs M and U are combined a final stage block priority encoder 538, as shown in FIG. 5.

Comparing the implementations of FIGS. 3b and 5, both have a final block priority encoder stage 318 and 538 respectively merging masked and unmasked codes M and U. FIG. 3b has two priority encoders 312 and 310, each a tree of block priority encoder stages, with one of the priority encoder's inputs gated by a full width thermometer code mask 316. In FIG. 5, for the masked code M, there is a tree of block priority encoder stages 510-524, a level of and-or gates 526-532, then the rest of the tree of block priority encoder stages. The difference between the FIGS. 3*b* and 5 is the level of and-or gates inserted between two adjacent layers in the block priority encoder tree. The unmasked priority encoder tree has the output portion of the tree, then the rest of it in the priority encoders in the replicated blocks. This logic is exactly equivalent to the lower priority encoder of FIG. 3*a*, except that intermediate outputs are also tapped for use by the and-or gates. FIG. 5 also differs from 3*a* in that the thermometer decoders at the front only use lsb's rather than the full code width, with the rest of the decoding done at later stages.

The comparison between the two implementations illustrates that removing msb's from the thermometer codes at the front requires adding a level of and-or gates to put in their effect later. This may decrease the delay of the front thermometer decoder, but adds a delay back in later.

Looking back at FIG. 2, the outputs 238-242 of all the blocks' circular priority encoders 214-218 are combined using a block priority encoder 232. As conventionally done, this block priority encoder 232 may consist of a number of block priority encoder stages, with each doubling the total width of the input data. With modulo 2 block priority encoder stages such as that of FIG. 4, there would be log 2(B) stages where B is the number of blocks.

Figure 6:
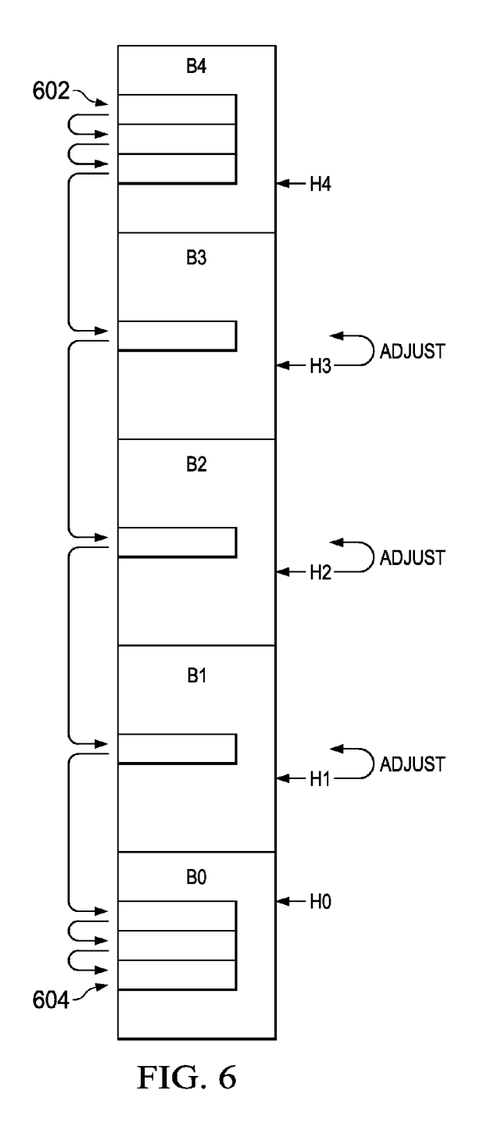
FIG. 6 is a block diagram of a TCAM according to embodiments of the invention

Given the structure of FIG. 2, it will now be shown how it can be used to reduce the number of TCAM entry moves required when adding an entry. FIG. 6 shows a TCAM according to an embodiment of the invention, with 5 blocks for the purposes of this example, labelled from B0 to B4, with B4 at the top having the highest priority. Each block has a headpointer, H0 through H4, currently set for illustrative purposes at arbitrary locations for the different blocks. The new entry 602 goes into block B4, while the nearest vacant entry 604 is in B0. In a conventional TCAM, this would require shifting all entries from the new location to one entry above the vacant location down by 1.

The entry addition proceeds in three steps. First, the entry is added at a target location to B4, called the target block. This may require shifting a number of entries in B4, but recall, the size of B4 is on the order of the square root of (N), so this is a smaller number of moves than the prior art. The second stage involves shifting entries through middle blocks, in this case B3 through B1. This involves one move per block, and will adjust the block's headpointer H0-H4. In the third stage, an entry is added to B4, called the free block. This may necessitate shifting a number of entries in B4, but recall again that this block size is on the order of the square root of (N). In some cases the headpointers of the target block (B4 in this example) and the free block (B0 in this example) are also adjusted.

These three steps will be described in detail. While FIG. 6 described a case where the vacant location was in a lower priority block than the target location, the opposite case is also possible, where the vacant location is in a higher priority block than the target location. The former case will be called evict to lower, while the latter will be called evict to higher, or alternatively, move lower vs move higher. These correspond to the two directions, up or down, that existing data would have to move in a conventional TCAM to make room for the new entry.

The first step adds an entry at the target location into the target block. The target block is assumed full for this example, with no empty locations, so an entry will have to be evicted to make room for the new entry. As stated before, there are two cases possible for the data move direction, move lower and move higher. There is also a second variable of interest; whether the target location where the new entry is to be added is closer to the head or closer to the tail of the block. This second variable determines which direction to shift data within the target block; the direction which will result in fewer moves is chosen. The maximum number of moves will be M/2, half the number of entries in the block.

The cross product of the two different variables, evict to lower vs upper, and closer to head vs tail, result in four possibilities, each of which is considered in turn.

Figure 7A:
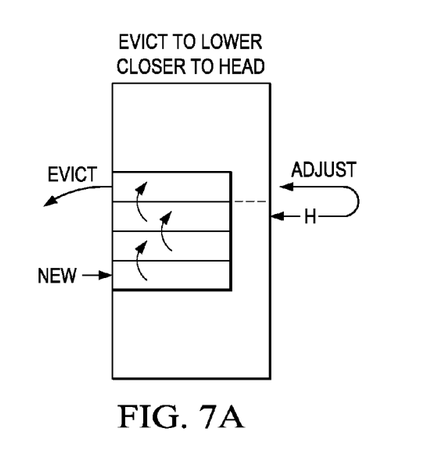
FIG. 7a is a block diagram illustrating a case of evict to lower, closer to head according to an embodiment of the invention.

FIG. 7*a* illustrates the case of evict to lower, closer to head. Like FIG. 6, the target block is a higher block than the free block, so the entry evicted from the target block will move to a lower block, hence the evict to lower category. The tail entry is evicted, since it is the lowest priority entry in the block, which has to evict an entry to a lower block. Here, the new entry is closer to the head than to the tail. In this case, the tail entry is located one above the headpointer. The entry at the headpointer is moved up one, into the location formerly occupied by the tail, and the headpointer is adjusted by 1 (incremented) to point to the former tail location. The entry one below the former head location is moved up one, as is the one below that, until the entry occupying the target location is moved out of it. With the target location free, the new entry can be added there.

The calculation of whether the target location is closer to the head or tail must take into account the wraparound nature of the entry storage in the block. For block size M, headpointer H and target location T, if H>T, then if H−T<M/2, the target is closer to the head. If H<T, then if H+M−T<M/2, the target is closer to the head.

Figure 7B:
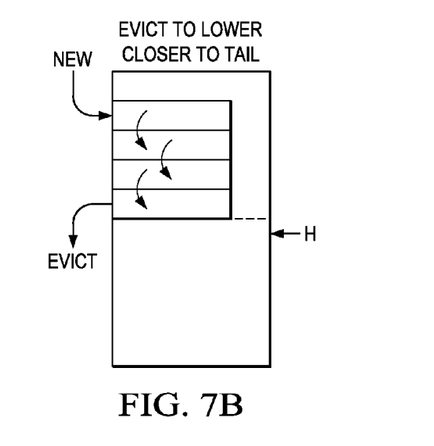
FIG. 7b is a block diagram illustrating a case of evict to lower, closer to tail according to an embodiment of the invention.

FIG. 7*b* illustrates the case of evict to lower, closer to tail. Here the tail is evicted from the target block, and all entries from one above the tail to the target location are shifted down by one. With the target location vacant, the new entry can be added there. Note this case is simpler than the previous case of FIG. 6, since no adjustment of the headpointer is made.

Figure 7C:
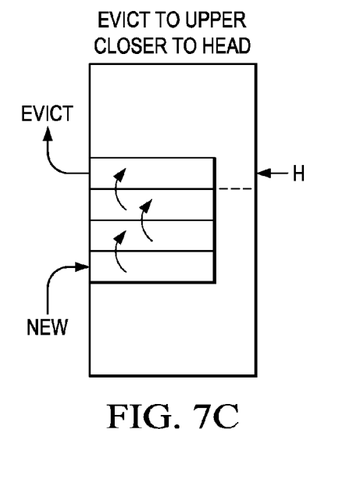
FIG. 7c is a block diagram illustrating a case of evict to upper, closer to head according to an embodiment of the invention.

FIG. 7*c* illustrates the case of evict to upper, closer to head. Evict to upper occurs in the case that the free block is a higher block than the target block. Here, it is the highest priority entry, at the headpointer, which is evicted to the next higher block. This leaves a vacancy at the head, so all entries from one below the headpointer to the target location are shifted up by one. This leaves the target location vacant, so the new entry can be added there. Like the previous case of FIG. 7*b*, this requires no adjustment to the target block's headpointer.

Figure 7D:
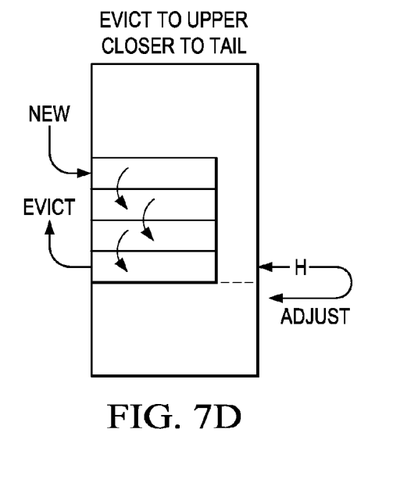
FIG. 7d is block diagram illustrating a case of evict to upper, closer to tail according to an embodiment of the invention.

FIG. 7*d* illustrates the case of evict to upper, closer to tail. Evict to upper means the highest priority entry, the one pointed to by headpointer, is evicted to the next higher block. This leaves a vacancy at the headpointer, but it is the tail entry which will be shifted there, so the headpointer is adjusted by one (decremented) to point to what was once the second highest priority entry and has now been promoted to the new highest priority entry. The former headpointer location is empty, so from one entry above that to the target location, entries are shifted one down. This leaves the target location empty, and the new entry is added there. Note this case is like FIG. 7*a*, evict to lower and closer to head, in that the headpointer is adjusted.

Figure 8A:
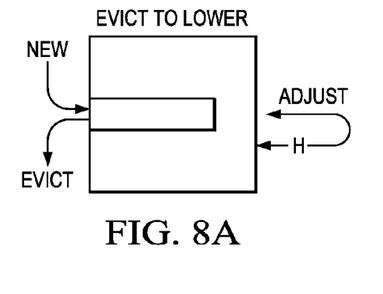
FIG. 8a is a block diagram illustrating a case of evict to lower according to an embodiment of the invention.

This completes discussion of the first step in adding an entry. The second step comes in two variants, evict to lower and evict to upper, shown in FIGS. 8*a* and 8*b*. FIG. 8*a* shows the evict to lower case, and is identical to the operations shown in FIG. 6 for blocks B1 to B3. With evict to lower, or move lower, the data flow is downwards. The lowest priority entry will be evicted, and the entry taking over its location will be the new highest priority entry. So the entry one above the headpointer is evicted, the new entry added in its place, and the headpointer is adjusted by one (incremented) to point to this location.

Figure 8B:
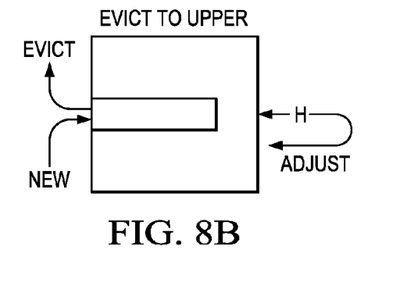
FIG. 8b is a block diagram illustrating a case of evict to upper according to an embodiment of the invention.

FIG. 8b shows the evict to upper case. With evict to upper, or move upper, the data flow is upwards. The highest priority entry will be evicted, and the entry taking over its location will be the new lowest priority entry. So the entry at the headpointer is evicted, the new entry added in its place, and the headpointer is adjusted downwards by one (decremented) to point to what was the second highest priority entry, and has now been promoted to the new highest priority entry.

The third step, adding the entry into the target block, the one with the vacancy, is shown in FIGS. 9a through 9d. It is similar to the first step shown in FIGS. 7a through 7d in that there are four cases due to the cross producting of the choices for evict to lower vs upper, and closer to head vs tail. Whereas in the first step, it was the target location which was determined to be closer to head vs tail, in this step it is the free location which is determined to be closer to the head or the tail. It is also similar to the first step in that in two of the four cases the headpointer gets adjusted, while in the other two it doesn't.

Figure 9A:
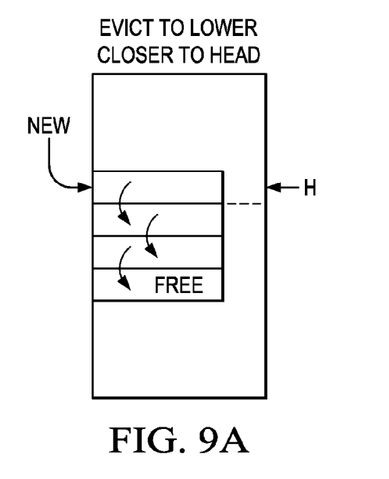
FIG. 9a is a block diagram illustrating according to embodiments of the invention.

FIG. 9a illustrates the case of evict to lower, closer to head. Evict to lower means the incoming packet to this block is coming from a higher block and will be the new highest priority entry in this, the free block. With the free entry closer to the head than tail, entries from one above the free location up to the head entry have to be moved down one. That leaves the head entry vacant, so the new (to this block) entry can be placed there.

Figure 9B:
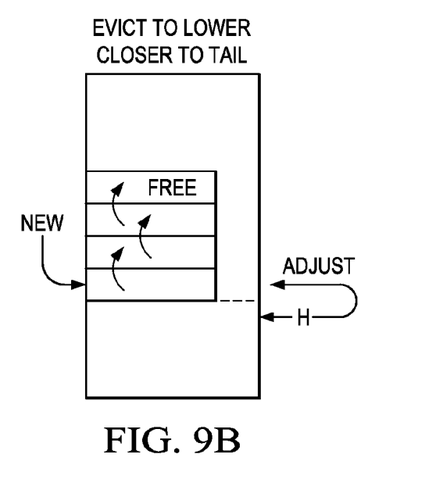
FIG. 9b is a block diagram illustrating according to embodiments of the invention.

FIG. 9b illustrates the case of evict to lower, closer to tail. The entries from one below the free location down to the tail entry are moved up one, leaving the tail location empty. The new entry is placed in the tail's former location. Since this new entry is coming from a higher block, it is now the head, and the headpointer is adjusted by one (incremented) to point to this new entry.

Figure 9C:
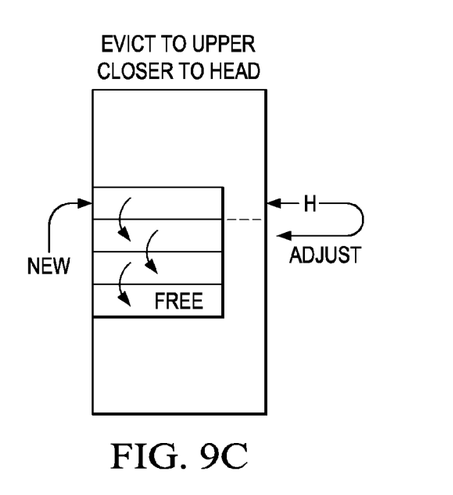
FIG. 9c is a block diagram illustrating according to an embodiment of the invention.

FIG. 9c illustrates the case of evict to upper, closer to head. The new (to this block) entry is coming from a lower priority block. Starting from one above the free location up to the headpointer location, entries are moved down one. This leaves the head location free, and the new entry is added there. But evict to upper means the new entry is coming from a lower block and should be the lowest priority entry. So the headpointer is adjusted down one (decremented), following the movement of the highest priority entry which was moved from the former headpointer location down one.

Figure 9D:
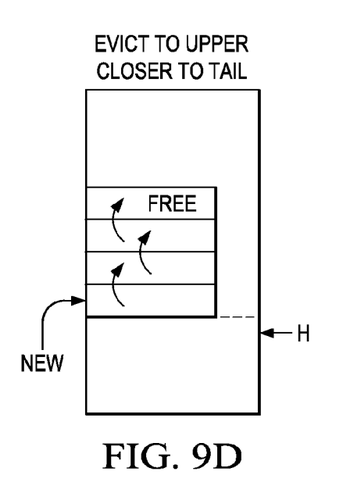
FIG. 9d is block diagram illustrating according to an embodiment of the invention.

FIG. 9d illustrates the case of evict to upper, closer to tail. Evict to upper means the new entry is coming from a lower priority block and will be the lowest priority entry in this block. So entries starting one below the free location down to the tail location are moved up one, freeing the tail location, into which the new entry is added.

There are a few degenerate cases. Recall that the first step involves operations on the target block, the second step involves operations on the middle blocks, and the third step involves operations on the free block. If the free block is adjacent to the target block, there are no middle blocks and step 2 is omitted, with the evicted entry from step one providing the new entry for step 3. The final case is when there is a vacancy in the target block. In this case, the nearest vacancy is found to the target location, and all the entries from the target location to the location next to the vacant one are shifted in the direction of the vacant location. The nearest vacant location is found disregarding whether or not it is on the other side of the headpointer from the target location. If the target and vacant location are on opposite sides of the head pointer, then one of the entries moved will be the head entry, and in that case the headpointer is adjusted by one in the direction of the move, so it remains pointing to the same entry.

It was stated earlier that using this structure and method, the maximum number of entries moved when adding an entry is 2 times the square root of (N). If a TCAM of size N words is divided into B blocks of M entries each, where both B and M are equal to the square root of (N), then in step one and step three the maximum number of moves in each step is M/2, or M for steps one and three combined. The maximum number of moves in step 2 is B−1, approximately B. So the total maximum number of moves=B+M=2 time the square root of (N).

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A TCAM (Ternary Content Addressable Memory) comprising:
   a plurality of TCAM blocks wherein each TCAM block in the plurality of TCAM blocks stores a plurality of match entries; wherein each TCAM block in the plurality of TCAM blocks is ranked in priority order; wherein each TCAM block in the plurality of TCAM blocks outputs a plurality of match outputs;
   a plurality of TCAM block headpointers wherein each TCAM block headpointer in the plurality of TCAM headpointers is coupled to a TCAM block in the plurality of TCAM blocks; wherein each TCAM block head pointer is operable to point to any match entries in the plurality of match entries in a TCAM block; wherein the TCAM block head pointer indicates a highest priority match entry from the plurality of match entries,
   a plurality of circular priority encoders, wherein each circular priority encoder in the plurality of circular priority encoders receives the plurality of match outputs and the highest priority match entry; wherein each circular priority encoder in the plurality of circular priority encoders outputs an bit vector;
   a first block priority encoder, wherein the first block priority encoder receives the bit vector from all circular priority encoders in the plurality of circular priority encoders; wherein the block priority encoder outputs an address of a highest priority bit vector.

2. The TCAM of claim 1 wherein each circular priority encoder in the plurality of circular priority encoders comprises:
   a thermometer mask, wherein the thermometer mask receives the plurality of match outputs and the highest priority match entry, and is coupled to a first priority encoder;
   a second priority encoder, wherein the second priority encoder receives the plurality of match outputs and the highest priority match entry, and is coupled to a second block priority encoder; wherein the first priority encoder is coupled to the second block priority encoder;

wherein the second block priority encoder outputs the bit vector.

3. A method of prioritizing input data in a circular priority order comprising:

receiving the input data;

comparing the input data to plurality of match entries in each of a plurality of TCAM blocks;

indicating a match for all match entries in each of the TCAM blocks in the plurality of TCAM blocks where a match occurs;

determining the highest priority matching TCAM block of the plurality of TCAM blocks which produces a match indication from any of its match entries; and determining the highest priority match from all of plurality of match entries in the highest priority matching TCAM block using the TCAM block head pointer couple to the highest priority matching TCAM block to indicate the highest priority match.

* * * * *